United States Patent [19]

Ward

[11] 3,863,113

[45] Jan. 28, 1975

[54] MODULAR FORMED WIRE CARDCAGE

[76] Inventor: Llyd G. Ward, 3142 Lariat Dr., Garland, Tex. 75042

[22] Filed: Jan. 4, 1974

[21] Appl. No.: 430,632

[52] U.S. Cl. ............ 317/101 DH, 211/41, 211/41

[51] Int. Cl. ............................................ H02b 1/02

[58] Field of Search ............ 317/107 DH; 211/41, 211/40, 181, 184; 312/190

[56] References Cited

UNITED STATES PATENTS 3,269,547 8/1966 Chamberlin ........................ 211/184

OTHER PUBLICATIONS

Schuster, I. N., "8 More Printed Circuit Guides," Product Engineering, June 10, 1963, pp. 96, 97.

*Primary Examiner*—David Smith, Jr.

*Attorney, Agent, or Firm*—Warren H. Kintzinger

[57] ABSTRACT

A modular printed circuit board cardcage of formed wire card guide and retainer members fastened to transverse support rods within a semi-enclosure structure. Cardcage modules of different sizes and shapes are configured to accommodate various printed circuit board size and quantity requirements. Each printed circuit board is securely mounted to withstand shock and vibration forces but is readily accessible and removable for maintenance in a modular cardcage structure with optiminally high printed circuit board packaging density and minimal obstruction to the flow of component cooling air.

13 Claims, 13 Drawing Figures

MODULAR FORMED WIRE CARDCAGE

Figure 1:
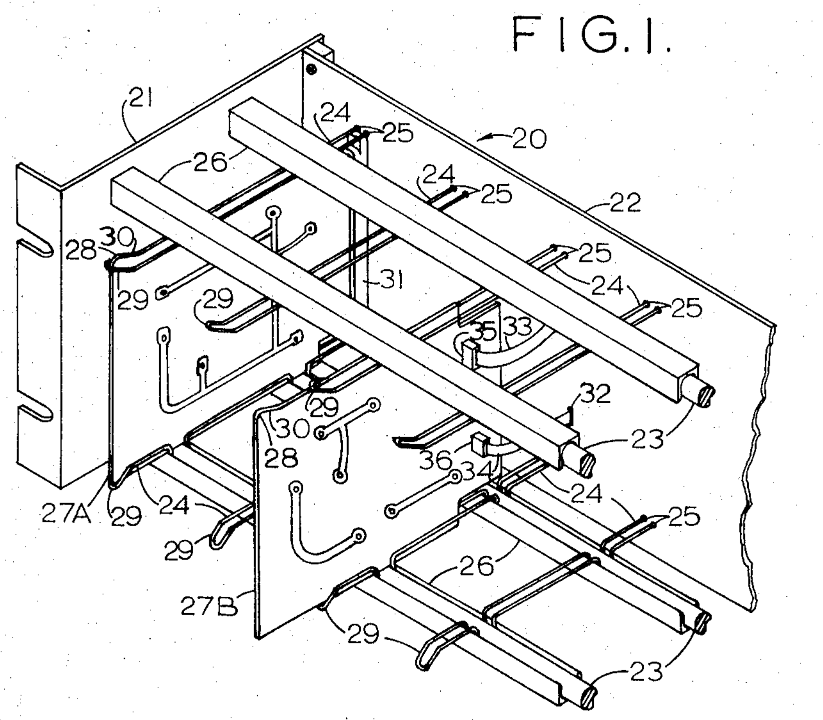

This invention relates in general to printed circuit board mounting frames and in particular to a printed circuit board modular cardcage that uses formed wire guide holding members to position and retain circuit boards in an electronic equipment support structure.

The advent of printed circuit boards for mounting a multiplicity of small electronic devices created a need for mounting frames to securely hold such circuit boards within electronic equipment and systems. The requirements for such mounting frames call for great variety of configurations since circuit boards, individually, vary in size and configuration, and various equipment systems use boards in quantities from one to hundreds. Sometimes circuit board mounting frames are built into basic equipment structure that already has the size, configuration, and number of circuit boards fixed by design; other times, design packaging requirements specify a space location for a circuit board mounting frame or cardcage module, or modules. Typical module design incorporates a sheet metal enclosure, or semi-enclosure, holding circuit board edge guides separated by spacer members, and having some type of circuit board position lock retainers. Welded wire guides and spring retainers, requiring extensive, expensive assembly of a multiplicity of individual pieces, have been used to provide semi-open, to open, enclosure modules. Open enclosure modules are desirable, as they allow greater air flow for the cooling of heat generating components on circuit boards. Savings in material, weight, and assembly time are desired with, however, structural strength of the module and accessibility of circuit boards being maintained. Modules must be capable of sustaining shock and vibration forces while securely retaining circuit boards in position within the modules. To maximize the number of boards that can be mounted in an available space, varied lateral spacing of circuit boards within a module is important.

It is therefore a principal object of this invention to provide a printed circuit board modular cardcage having lightweight, structurally strong framing and circuit board holding members to accommodate a variety of circuit board and component size and quantity requirements.

Another object is to provide such a cardcage with good accessibility for installation and maintenance of circuit boards.

A further object is to provide a cardcage with minimum obstruction to air flow from either natural convection or from forced air for cooling of equipment.

Another object is to provide a cardcage allowing varied lateral spacing of circuit boards in achieving proper alignment and optimum packaging density.

Still another object is to provide such a cardcage that utilizes low-cost formed wire printed circuit board holding guide members.

A further object is to provide a cardcage with simple circuit board position locking with the formed wire board holding guide members.

Another object is to achieve, with such a cardcage design, alternative assembly methods utilizing cost-effective techniques and materials.

Features of the invention useful in accomplishing the above objects include, in a modular formed wire guide cardcage, a pair, or pairs, of formed wire circuit board holding guide members, spaced apart and facing one another, to hold a printed circuit board between each pair of guide members; the guide members being firmly fastened to transverse support members. Each wire guide member is shaped into a generally U-shape, with enlongated legs having intermediate bends to accommodate mounting on, and fastening to, transverse support members. Some of the wire guide members have closed ends, through a U-shaped end bent to form a cantilever spring retainer clip automatically catching a circuit card right angle corner or corner tab projection.

Figure 2:
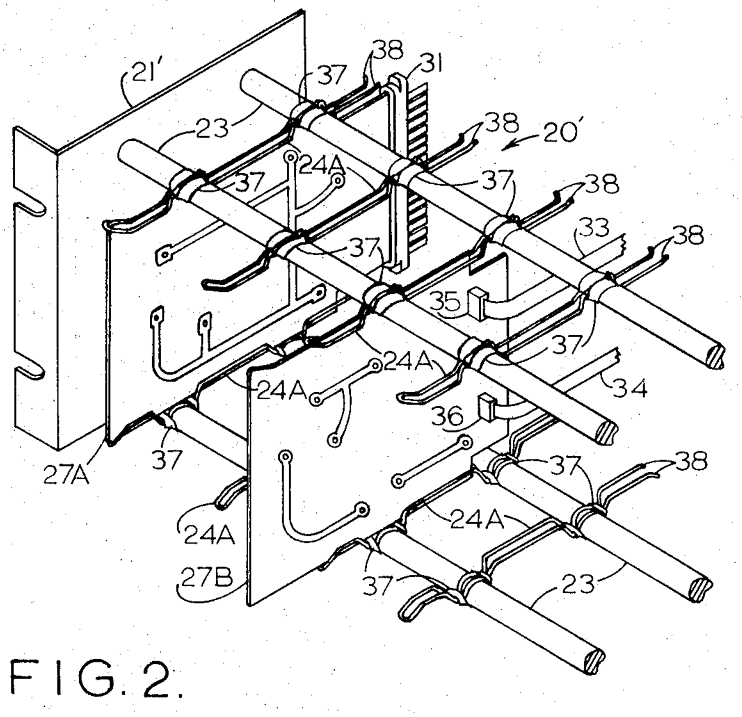
Figure 3:
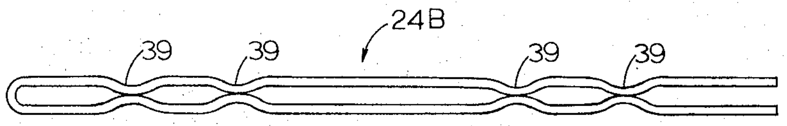
Figure 4:
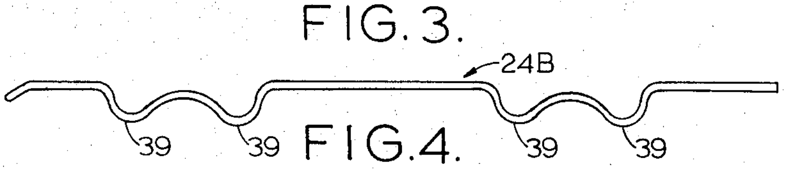
Figures 5, 6, 7:
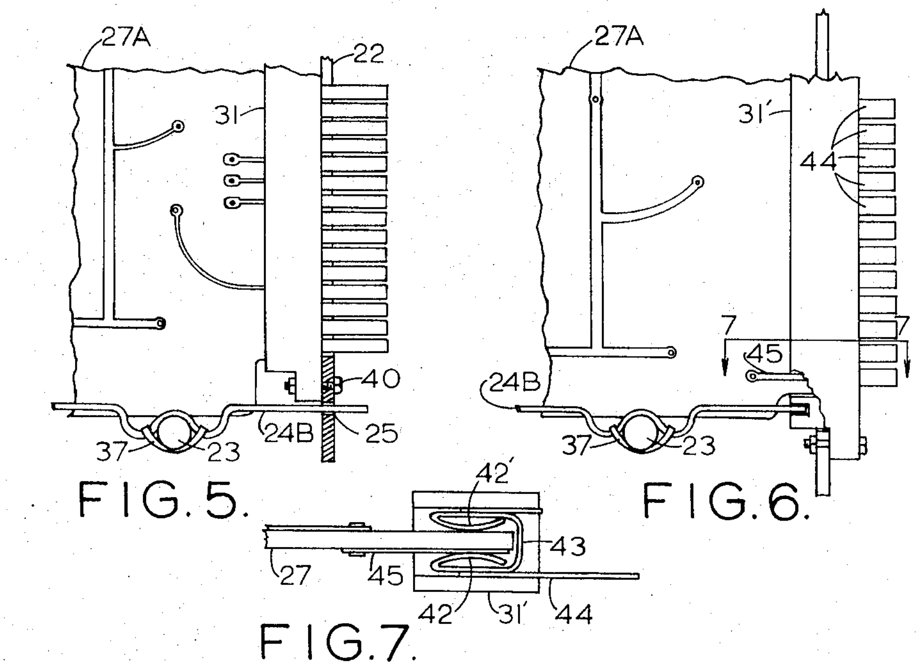
Figure 8:
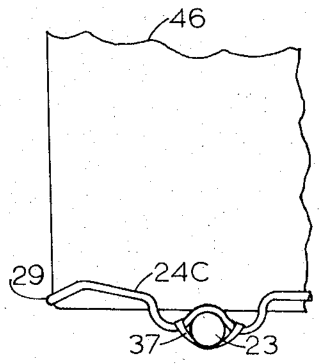
Figure 9:
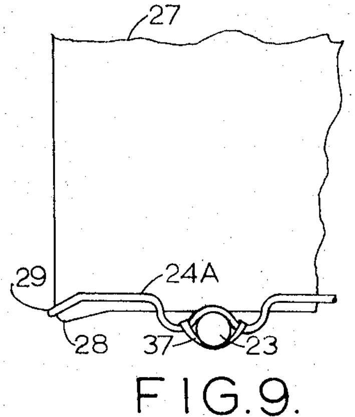
Figure 10:
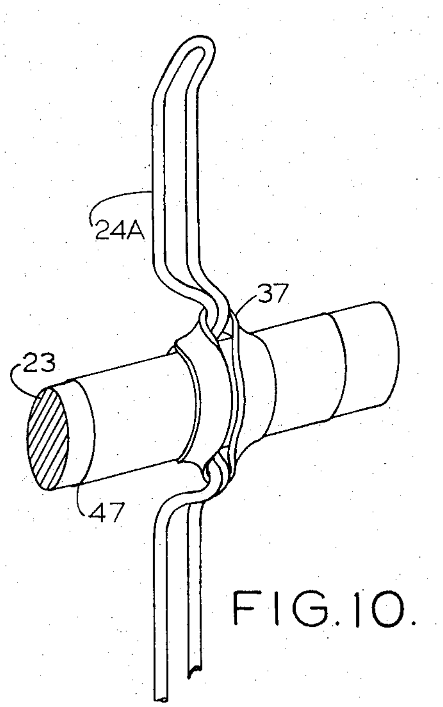
Figure 11:
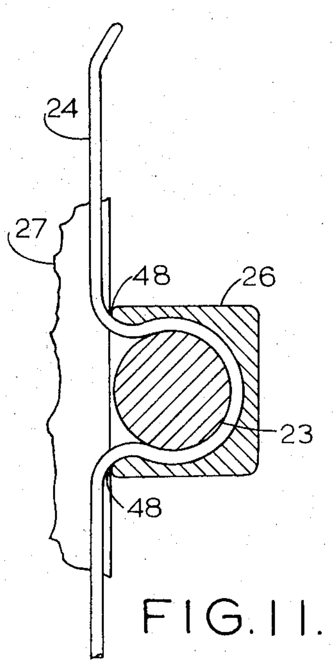
Figure 12:
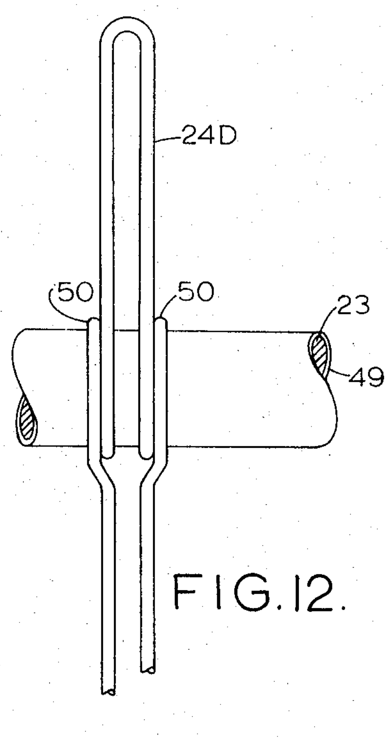
Figure 13:
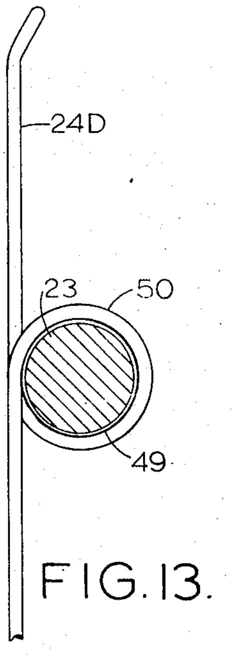

In the drawings:

FIG. 1 represents a perspective view of a portion of a modular formed wire guide cardcage, partially broken away and sectioned, with one printed circuit board positioned and held by formed wire guides inserted into a backplane plate, one printed circuit board partially inserted into a pair of formed wire guides, and two other pairs of formed wire guides installed and available to receive printed circuit boards;

FIG. 2, a perspective view of a portion of a modular formed wire guide cardcage with circuit boards and formed wire guides as in FIG. 1, but with no backplane plate on the cardcage, and with the formed wire guides fastened to transverse support members by shrunk-fit bands rather than by the resilient elongate clips of FIG. 1;

FIG. 3, a top plan view of a formed wire guide having straight end extensions for insertion into a cardcage backplane plate or circuit board connector;

FIG. 4, a side elevation view of the formed wire guide of FIG. 3;

FIG. 5, a side elevation view, partially cut away and sectioned, of a printed circuit board installed in a formed wire guide that has ends inserted through holes in a cardcage backplane plate, and a circuit board connector fastened to the backplane plate;

FIG. 6, a side elevation view, partially cut away and sectioned, of a printed circuit board installed in a formed wire guide modular cardcage having a backplane plate with a circuit board connector extending through the backplane plate, and a formed wire guide mounting with end extensions in holes in the connector;

FIG. 7, an enlarged partial cross section view along line 7—7 of FIG. 6, showing a circuit board edge connected in the circuit board connector;

FIG. 8, a side elevation view, partially cut away, of a printed circuit board installed in a formed wire guide modular cardcage, with the formed wire guide board retainer end formed to spring deflect hold a square cornered circuit board;

FIG. 9, a partial side elevation view with the formed wire guide retainer end formed to spring deflect retain a tab-cornered circuit board;

FIG. 10, an enlarged perspective view, partially cut away, of a formed wire guide attached to a transverse support member by a shrunk-fit retainer band where the transverse support member is coated with a position retaining material;

FIG. 11, a side elevation view, partially cut away and sectioned, of a formed wire guide attached to a transverse support member by a resilient elongate clip;

FIG. 12, a top plan view, partially cut away, of a formed wire guide installed on a lateral support member which has been solder coated; and, FIG. 13, a side elevation view, partially cut away and sectioned, of the formed wire guide and transverse support member of FIG. 12.

Referring to the drawings:

The modular formed wire cardcage 20 of FIG. 1 is shown with a side mounting bracket plate 21 (The cardcage opposite side end, not shown, has a mirror image similar mounting bracket plate.) fastened to a backplane plate 22 and four transverse support members 23. A plurality of formed wire card guide holding members 24 are positioned through alignment and retaining holes 25, extending through the backplane plate 22. Resilient plastic elongate retaining clips 26 hold with clamping compression force the formed wire card guide holding members 24 in position on the transverse support members 23. (Additional detail of resilient plastic elongate retaining clips 26 is presented in the cross-sectioned showing of FIG. 11.)

Pairs of formed wire card guide holding members 24 are positioned in vertical alignment to guide and hold printed circuit board 27 between each such pair in a desired location relative to the backplane plate 22, and to other circuit boards or system components. Lateral spacing of formed wire card guide holding members 24 may be varied to accommodate individual circuit board space requirements by selective location of alignment and retaining holes 25, drilled through the backplane plate 22. Lateral spacing along the transverse structural members 23 is selectable and adjustable prior to installation of longitudinal spring clips 26; and because no spacers are used, excessive misalignment due to cumulative tolerance variations can be avoided by using the actual printed circuit boards and backplane plate to align and space the formed wire card guide holding members 24.

One printed circuit board 27 is shown partially slid into, or out of, position, held by a pair of formed wire card guide holding members 24, as would occur during installation or maintenance. An integrally formed ramped tab projection 28 on one corner of each printed circuit board 27A and 27B acts as a retainer stop within the respective outwardly turned closed ends 29 of formed wire guide holding members 24. The pairs of formed wire guide holding members 24 are vertically spaced so that a printed circuit board 27A or 27B will easily slide between the outwardly turned closed ends 29 of a selected pair, with the linear longitudinally extended shank sections of each formed wire card guide holding member 24 overlapping the upper or lower edge along the length of the printed circuit board 27A or 27B to guide and laterally restrain the board 27A or 27B. As a printed circuit board 27 is slid in with slight manual force to the depth of the formed tab projections 29, the ramp-like edge 30 of the formed tab projection 28 of that board pushes against an outwardly turned closed end 29 of the respective formed wire card guide holding member 24, moving that closed end 29 outward in cantilever spring action. When the outer end of tab projection 28 slides under the outwardly turned closed end 29, the spring action forces the closed end 29 downward so that it loops around the outer facing end front edge of tab projection 28 to act as a retainer for the entire printed circuit board 27. Slight finger pressure, upward, under a closed end 29 will move it above the tab projection 28 and allow removal of that printed circuit board 27A or 27B. Restraint on movement of a printed circuit board 27A in the direction of the backplane plate 22 is provided by a circuit board edge connector 31 into which the circuit board 27A is plugged, or by the backplane plate 22, where no edge connector is used, as illustrated by printed circuit board 27B. In this arrangement, there are openings 32 in the backplane plate 22 through which are extended ribbon cables 33 and 34 having end plug connectors 35 and 36 that plug onto circuit board components or pins.

The modular formed wire cardcage 20′ of FIG. 2, is similar to that of FIG. 1, except that no backplane plate is used. Further, an alternate method of securing the formed wire card guide holding members 24A to the transverse support members 23 is shown in FIG. 2. Bands 37 of heat-shrinkable plastic material are looped over the formed wire card guide holding members 24A to hold the members 24A on the transverse support members 23 with the circular bands 37 extended between opposite ends of a compound bend in the formed wire card guide holding member 24A. The bands 37 are loose when installed, to allow lateral positioning of the formed wire card guide holding members 24A along the transverse support members 23 and, when heated, the bands 37 shrink to securely hold the relative positions of the formed wire card guide holding members 24A and transverse support members 23. Detail of a heat-shrinkable plastic material band 37, shrunk in place, is shown in FIG. 10. This method of securing formed wire card guide holding members 24A can be used with the backplane type modular formed wire cardcage 20 of FIG. 1. Also, the resilient longitudinally extended retaining clip 26 of FIG. 1 can be used with the open type modular formed wire cardcage 20′ of FIG. 2.

The formed wire card guide holding members 24A of FIG. 2 have the open end projections 38 bent outward, away from the printed circuit board slot, to prevent possible scratching of a board in case of reverse insertion—and to facilitate reverse insertion when desired. The open type modular formed wire guide cardcage 20′ is useful as a manufacturing and storage jig, or rack, and where design precludes the use of a backplane. Also, the flow of cooling air is greater than with the backplane type of FIG. 1, and two-side access to circuit board 27 is possible. A circuit board 27A in FIG. 2 could be connected to an edge connector 31, having no rigid mounting as does the edge connector 31 of FIG. 1, or to an edge connector (not shown) mounted on a separate surface, or board 27B to various plug connectors on wire and ribbon cables 33 and 34.

The modular formed wire cardcages 20 and 20′ allow great flexibility of design in that any number of printed circuit boards can be accommodated as determined by the length of transverse support members 23 used. This length is limited only by practical considerations of chassis size and structural rigidity in a given module design. Where protective coating of modules is used, the minimized surface area in a formed wire cardcage module, as compared with conventional sheet metal modules, greatly reduces coating material requirements.

The formed wire guide holding member 24B of FIGS. 3 and 4 includes a typical compound bend form required for use with the heat-shrinkable plastic bands 37. The two legs of the member 24B are brought together at the points 39 over which the plastic bands 37 are looped, and the legs are also bent near the points 39 to partially wrap around the transverse support members 23. The two legs are spread apart to form a printed circuit card guide and hold slot throughout the general linear shank portion of each member 24B. Straight-pronged end projections are illustrated, as would be used where the formed wire guide holding member 24B inserts through openings 25 in backplane plate 22 of FIG. 5, or into openings 41 of an edge connector 31′ in FIG. 6.

FIG. 5 is a detail view of the formed wire guide holding member 24B used with a printed circuit board edge connector 31 where the formed wire card guide holding member 24B inserts through holes 25 in a backplane plate 22, and an edge connector 31 is fastened to the backplane plate 22 by screw and bolt assemblies 40.

With the alternate type of edge connector 31′, illustrated in FIG. 6, the formed wire card guide holding member alignment and receiving holes 41 are provided in the body of edge connector 31′. The formed wire guide holding member 24B thus automatically aligns a circuit board 27A with the circuit board edge receiving slot of edge connector 31′.

To minimize the insertion force required, a printed circuit board 27A, inserted into an edge connector 31′ (as in FIg. 7), should align approximately centrally in the circuit board edge receiving slot between the formed spring ends 42 and 42′ of internal contact strip 43 having external terminal 44. This also assures secure resilient spring holding of the circuit board 27A in the connector 31′, and electrically conductive contact between the circuit board terminal strips 45 and the internal contact strip formed spring ends 42. Alignment along the length of the circuit board edge receiving slot is also important to create an electrically conductive path from terminal end 45 through the proper internal contact strip 43 to its respective external terminal post 44. Edge connector 31 of FIG. 5 would look essentially the same in cross section as does edge connector 31′ in FIG. 7. Both methods of installing formed wire card guide holding members and circuit board edge connectors (as shown in FIGS. 5 and 6) help assure proper alignment of circuit board terminal strips and edge connector internal contact strips, with resulting better electrical contact and lower insertion force required.

FIGS. 8 and 9 illustrate two methods of using formed wire card guide holding members 24C and 24A to retain printed circuit boards 46 and 27. In FIG. 8, a right-cornered printed circuit board 45 is used with the formed wire card guide holding member 24C, bent from approximately the compound bend in contact with transverse support member 23, to bring the outer closed end 29 over the circuit board corner as a cantilever spring retainer. This approach simplifies printed circuit board manufacture because no ramped tab projection needs to be provided. FIG. 9 is a detail view of the formed wire card guide holding member 24A, having its closed end 29 act as a cantilever spring retainer where a ramped tab projection 28 is provided on circuit board 27, as described previously for FIG. 1.

An enlarged detail view of a heat-shrinkable plastic band 37, used to secure a formed wire card guide holding member 24A to a transverse support rod 23, is shown in FIG. 10. A coating material 47 is shown on a portion of transverse support member 23. Although the coating material 47 may be paint, shellac, metal, or other protective material—applied by brushing, spraying, or dipping—a particularly suitable coating is a thermosetting liquid adhesive that air-dries to a tack free film. Lateral positioning retaining of formed wire card guide holding members 24A along the transverse support member 23 is facilitated by the high friction coefficient of the film 47. With heat curing, the heat-shrinkable circular band 37 draws up tightly around the pieces 23 and 24A while the coating material 47,sets up as a high strength adhesive, adding strength to the joint between the formed wire card guide holding member 24A and transverse support member 23. The coating material 47, after heat curing, in addition to the adhesive action between joined parts, adheres to the transverse support member 23, or any other parts it is applied to, as a protective insulating plastic film coating that is not sticky nor tacky after cooling.

The longitudinally extended resilient material spring clip 26, shown in transverse cross-section in FIG. 11, is the method of fastening formed wire card guide holding members 24 to transverse support members 23, used in FIG. 1. This method eliminates the need for heat-shrinkable plastic bands, the need for welding, or for other means of securing each individual intersection, and thereby greatly reduces assembly time. With the clip 26 in position, printed circuit boards 27 slide in contact with the clip edges 48 and do not contact the transverse support members 23. The clip 26 is usually of a plástic material with a low coefficient of friction, which facilitates circuit board 27 insertion. When the elongate plastic clips 26 are used, board edge damage that may occur where boards are slid into contact with metal transverse support members 23 is not likely to occur. Obviously, the formed wire card guide holding members 24 are bent in a different manner for this type of lateral support rod connection than for that shown in FIG. 10.

With the emmbodiment of FIGS. 12 and 13, transverse support members 23 are provided with a solder coating 49 for fixing the position of the formed wire card guide holding members 24D, where such members 24D are formed with integral circular loops 50 otherwise having close-sliding fits on support rods 23. After assembly, the entire modular formed wire cardcage is furnace-brazed to permanently solder-bond the formed wire card guide holding members 24D to the transverse support rods 23. Other methods of assembling formed wire card guides and transverse support members can be used while retaining the basic formed wire card guide holding member module configuration.

Whereas this invention is herein illustrated and described with respect to a plurality of embodiments thereof, it should be realized that various changes may be made without departing from the essential contributions to the art made by the teachings hereof.

I claim:

1. A board edge guide for use in a modular cardcage structure with board edge guides used in aligned pairs with: said board edge guide formed from a single length of wire; said single length of wire being bent back upon itself at a midregion to form two parallel legs open at one end and joined with the midregion forming a closed end; and intermediate transversely aligned bends in said parallel legs to facilitate mounting of said board edge guide in a modular cardcage structure.

2. The board edge guide of claim 1, wherein said parallel legs are spaced apart to guide and retain a board edge.

3. The board edge guide of claim 2, wherein said parallel leg open ends are straight for insertion in alignment guide holder holes.

4. The board edge guide of claim 2, wherein said parallel leg open ends are bent at angles forming a board reverse insertion guide.

5. A modular cardcage having: a plurality of board edge guides used in pairs with each formed from a single length of wire; said single length of wire being bent back upon itself at a midregion to form two parallel legs open at one end and joined with the midregion forming a closed end, a plurality of transverse support members; structural interconnecting means for said transverse members; and intermediate bends in said parallel legs for mounting of said board edge guide on said transverse support members.

6. The modular cardcage of claim 5, wherein a plurality of pairs of said circuit board guides are mounted on transverse support members; and each said pair of guides are spaced apart and facing one another in mirror-image fashion to guide and hold a circuit board between said two circuit board edge guides forming a pair.

7. The modular cardcage of claim 6, wherein said closed end is bent at an angle to said parallel legs to form an insertion guide for said circuit board.

8. The modular cardcage of claim 7, wherein said angle bent closed end overlaps a tab projection on a corner of said board when the board is fully inserted to retain said board fully inserted in said pair of circuit board guides.

9. The modular cardcage of claim 7, wherein one of each pair of said board guides having said angle bent closed ends is also bent to cause said angle bent closed end to overlap a board right angled corner and act as a retainer holding said board fully inserted in said pair of circuit board guides.

10. The modular cardcage of claim 7, wherein said cardcage is coated with a thermosetting protective coating having adhesive properties to aid in holding said board guides in assembled contact with said transverse support members.

11. The modular cardcage of claim 5, wherein said board guides are held in assembled positions of contact with said transverse support members by longitudinally extended resilient clips.

12. The modular cardcage of claim 5, wherein said board guides are held in assembled positions of contact with said transverse support members by bands of heat-shrunk material.

13. The modular cardcage of claim 5, wherein said board guides are fastened in assembled positions of contact with said transverse support members by a metal bonding process.

* * * * *